United States Patent [19]
Waibel

[11] Patent Number: 5,766,683
[45] Date of Patent: Jun. 16, 1998

[54] NICKEL DEPOSITION SYSTEM WITH A VAPOR RECOVERY SYSTEM

[75] Inventor: Fred E. Waibel, Wexford, Pa.

[73] Assignee: New American TEC, Fallon, Nev.

[21] Appl. No.: 745,450

[22] Filed: Nov. 12, 1996

[51] Int. Cl.$^6$ ................................................ C23C 16/00
[52] U.S. Cl. ........................ 427/252; 427/255.1; 118/715
[58] Field of Search ........................... 118/715; 427/252, 427/255.1

[56] References Cited

U.S. PATENT DOCUMENTS 3,800,740  4/1974  Robinson ............................ 118/725
3,826,225  7/1974  Forman ............................... 118/716

*Primary Examiner*—Richard Bueker
*Attorney, Agent, or Firm*—Olson & Hierl, Ltd.

[57] ABSTRACT

A nickel deposition includes a reactor system for producing nickel carbonyl and storing same as a liquid, a plating system where the liquid carbonyl is vaporized and applied to product and deposited thereon, with carbon monoxide being released in the process, a reclaim system for cooling the gases received from the plating system and cooling them to a temperature just above its freezing point to condense out and recover the liquid carbonyl, said reclaim system including a reclaim condenser, and a vapor recovery system including a gas receiver for receiving vapors from the reclaim system. The vapor recovery system includes a first stage compressor operatively connected to the first stage receiver for pressurizing the vapor to about 25 PSIG, and a first stage condenser operatively connected to the first stage compressor for cooling the vapors. A conduit communicates the vapor recovery system to the reactor system for forwarding the cooled vapors to a recycle pump receiver in the reactor system. A compressor is provided in the reactor system for compressing the gases from the recycle pump receiver to about 65 PSIG. The nickel deposition system recovers and recycles substantially all of the nickel carbonyl and the requirements for carbon monoxide are substantially reduced.

11 Claims, 5 Drawing Sheets

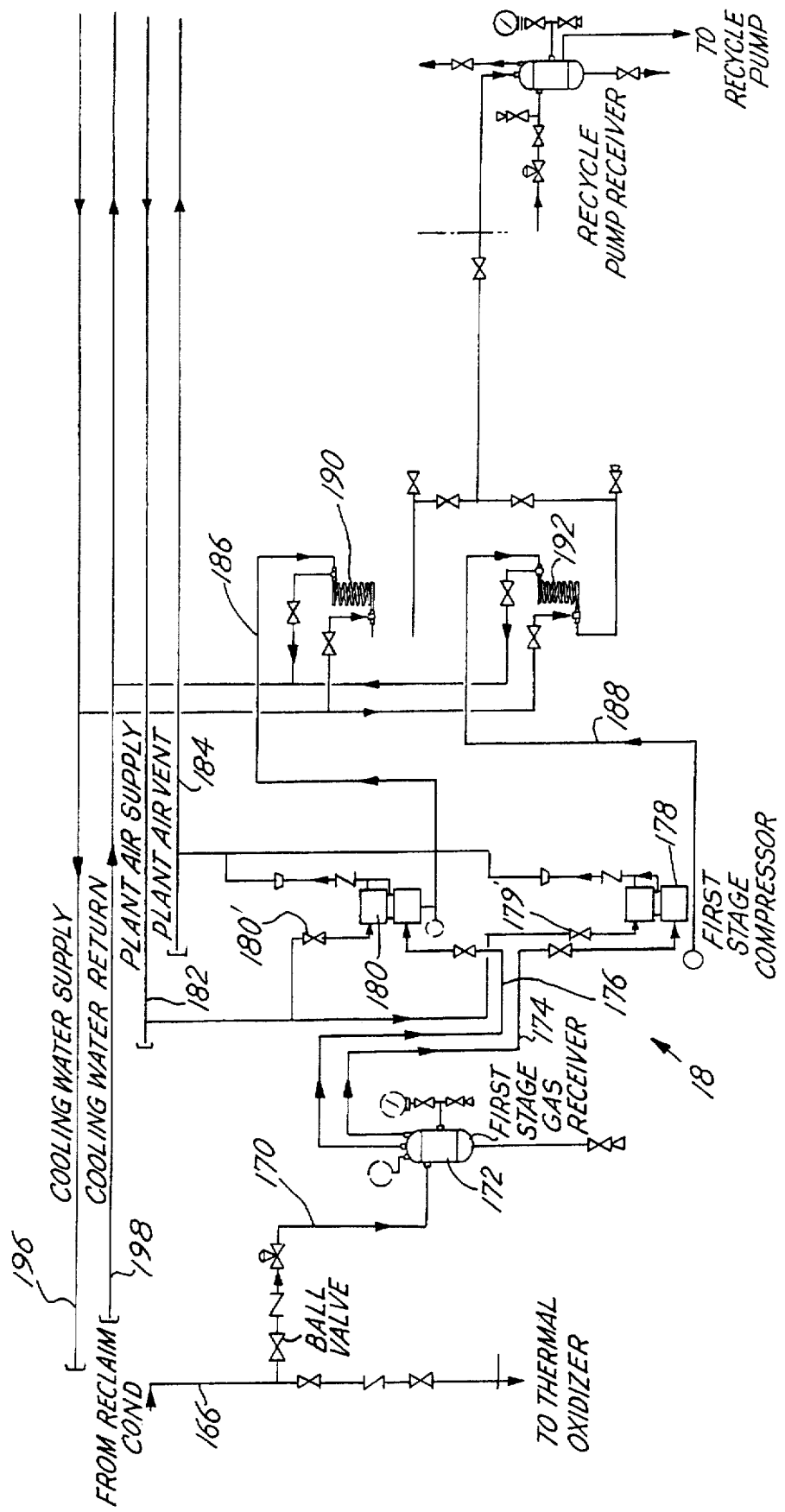

NICKEL DEPOSITION SYSTEM WITH A VAPOR RECOVERY SYSTEM

BACKGROUND OF THE INVENTION

This invention pertains to an improved nickel deposition system, and, more particularly, to a vapor recovery system for use with such nickel deposition system.

Known nickel deposition systems for chemical deposition include a nickel carbonyl reactor system which combines nickel powder and carbon monoxide gas to produce nickel carbonyl, storage of the nickel carbonyl, plating processes within a plating chamber, nickel carbonyl reclaim, and a thermal oxidizer to burn off and decompose all off gases. A concern with known systems was the large amount of carbon monoxide used in the production process. Also, it was desired to reduce the loss of nickel carbonyl in operation of the nickel deposition system.

By this invention it is proposed to add a recovery system to the nickel deposition system that maintains the process pressure just above atmospheric pressure when the temperature point of nickel carbonyl gas is just above freezing. This keeps the nickel carbonyl and carbon monoxide in a gaseous state (not frozen), and permits the process to flow uninterrupted. Within the system, the gas is compressed to about 25 PSIG with a booster compressor, and then the gas is cooled and mixed with the gases from the reactor system. The recovered carbon monoxide is mixed with the unreacted carbon monoxide gas from the reactor, significantly reducing the waste products and the requirement for additional carbon monoxide. The present invention contemplates compressing the gases a second time to about 65 PSIG after the gases are mixed and then recycling them through the reactor system to produce nickel carbonyl. The nickel carbonyl so produced can be used in the plating process.

An object of the present invention is to provide an improved nickel deposition system wherein disadvantages and deficiencies of prior like systems are obviated.

Another object of the present invention is to provide a nickel deposition system wherein substantially all of the carbon monoxide is recovered and recycled (over 70%) as compared with prior known systems wherein the carbon monoxide is burned and wasted.

Yet another object of the present invention is to provide an improved nickel deposition system that operates efficiently, with significant cost savings as compared to prior like systems, and that reduces the pollution to the atmosphere.

Still another object of the present invention is to provide a nickel deposition system with a vapor recovery system that will reduce the decomposition in the thermal oxidizer by about 70 percent and wherein even trace amounts of nickel carbonyl that might have gone to the thermal oxidizer will be recovered rather than wasted or lost.

Other objects and advantages of the present invention will be made more apparent hereinafter.

BRIEF DESCRIPTION OF THE DRAWING

There is shown in the attached drawing a presently preferred embodiment of the present invention wherein like numerals in the various views pertain to like elements and wherein:

FIG. 5 is a schematic drawing of the vapor recovery system of the present invention.

DETAILED DESCRIPTION OF THE PRESENT INVENTION

Figure 1:
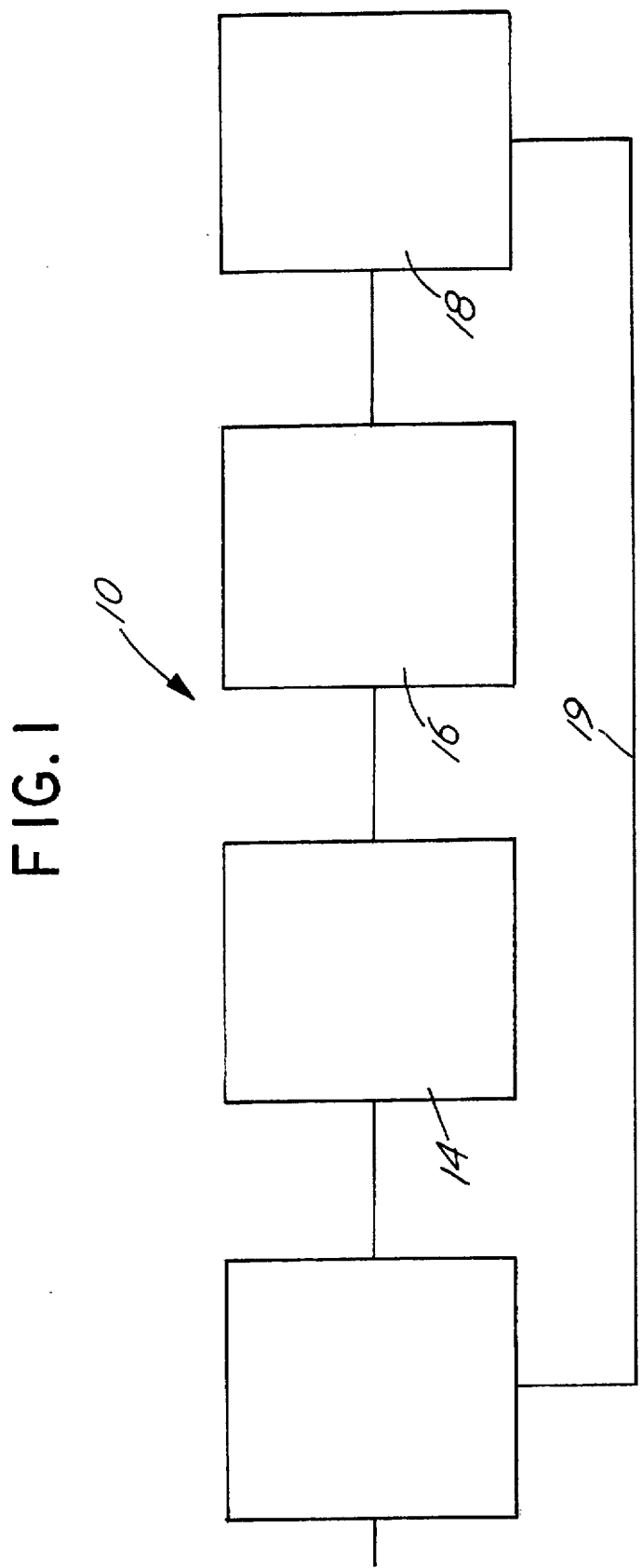
FIG. 1 is schematic drawing of the overall nickel deposition system.

With reference to FIG. 1 there is shown a schematic of the overall nickel deposition system, or what is sometimes referred to as a nickel vapor deposition system. The system 10 which includes a reactor system 12, a plating chamber system 14, a reclaim and thermal oxidizer system 16 and a vapor recovery system 18. In the reactor system 12 nickel carbonyl is produced and stored as a liquid. In the plating chamber system 14, the liquid nickel carbonyl is vaporized, sent to the plating chamber and when it contacts the hot surface of the mold the nickel is deposited and the carbon monoxide is released. In the reclaim and thermal oxidizer system 16, the gases from the plating chamber are cooled to a temperature just above its freezing point, which condenses out most of the nickel carbonyl, which is recovered and recycled. The non condensibles then go the vapor recovery system 18. In the vapor recovery system 18, the gases are compressed to 25 PSIG, then cooled and passed to the reactor system 12 through the return line 19.

Figure 2:
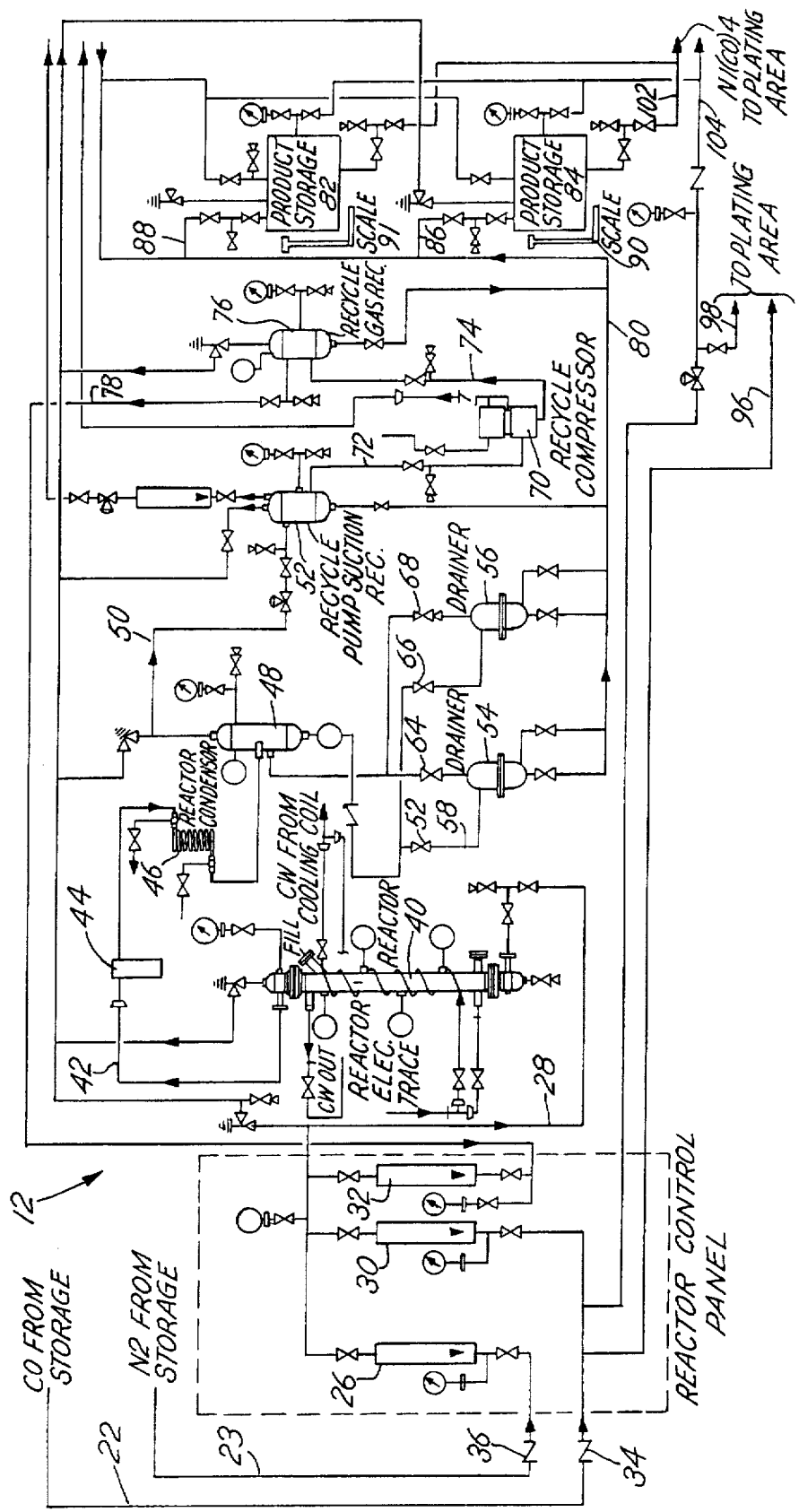
FIG. 2 is a schematic drawing of the reactor of the nickel deposition system.

Turning to FIG. 2, there is shown in more detail the reactor system 12 of the overall nickel deposition system 10. The reactor system 12 is adapted to receive carbon monoxide and nitrogen, respectively, from suitable storage tanks (not shown) via lines 22 and 23, respectively. The pressure of the nitrogen is on the order of 50 PSIG. The pressure of the carbon monoxide is on the order of 200 PSIG. The nitrogen is used essentially for purge purposes prior to starting the reactor system. Valve 34 in line 22 is a combination excess flow and back flow valve. If desired, two valves can be used rather than a single combined valve. The valve 36 in the line 23 is a combination excess flow and back flow valve. If desired, separate valves can be used rather than a single combination valve. The carbon monoxide will react with the nickel powder in the reactor 40 to form nickel carbonyl gas, which is used in the plating process. Line 22 communicates the carbon monoxide to flow meter 30 and from the flow meter 30 through the line 28 to the reactor 40. The nickel carbonyl formed in the reactor 40 passes through the line 42 and the filter 44 therein to the reactor condenser 46, where it is cooled. The nickel carbonyl passes to a separator 48, where the condensed nickel carbonyl is separated from the vaporous nickel carbonyl. The liquid nickel carbonyl flows to the drainers 54 and 56, via the lines 58 and 60, respectively. From the drainers 54 and 56, the liquid nickel carbonyl flows to the storage tanks 82 and 84 via lines 80, 86, and 88. The storage tanks 82 and 84 are carried on scales 90 and 92, respectively, in order to weigh the liquid carbonyl. Non condensed gases pass from the separator 48 via line 50 to the recycle pump suction receiver 52. From the recycle pump suction receiver 52 the gases pass to the recycle compressor 70 and then through line 74 to the recycle gas receiver 76. From the receiver 76 the gases pass through line 78 to the flow meter 32, from which they flow back to line 28 for recycling. Lines 96 and 98 communicate nitrogen and carbon monoxide, respectively, to the plating chamber system 14, as will be explained more fully hereafter. Line 102 will communicate liquid carbonyl to the plating chamber system 14 and line 104 will communicate carbon monoxide to the plating chamber system 14.

It is noted that various valves and sensors are employed in the reactor system to suitably control and sense the fluid flow.

Figure 3:
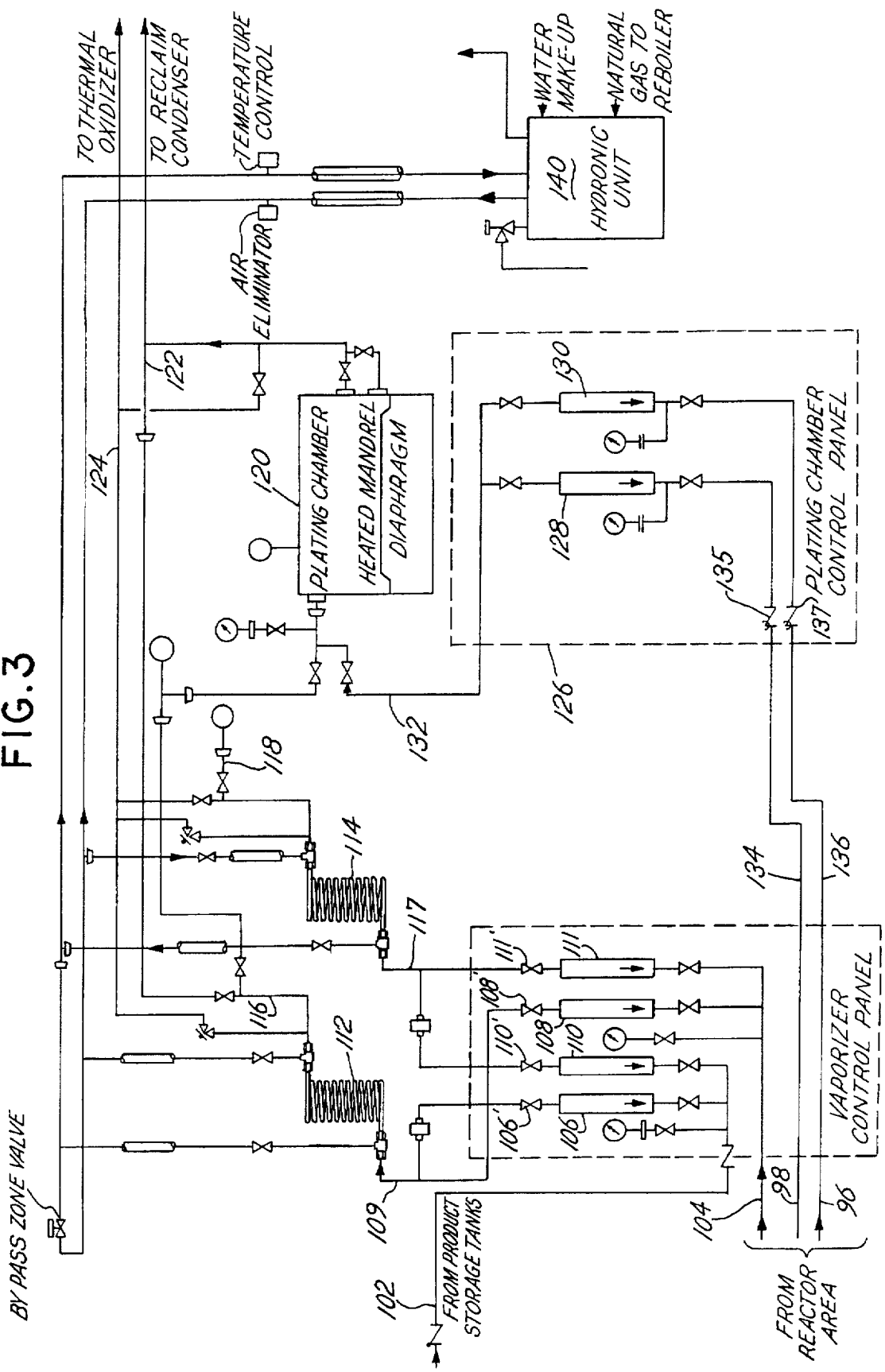
FIG. 3 is a schematic drawing of the plating system of the nickel deposition system.

Turning to FIG. 3, there is shown in more detail the plating chamber system 14 of the present invention. The primary flow of liquid carbonyl from the storage tanks 82 and 84 in the reactor system is through line 102. The liquid carbonyl flows through the flow meter 106 to the vaporizer 112. Carbon monoxide from the flow meter 108 is mixed with the nickel carbonyl before entering the vaporizer 112. The vaporizer 112 converts the liquid nickel carbonyl to a vapor. The nickel carbonyl vapor passes through the line 116 to the plating chamber 120. A plating chamber control panel 126 is provided to adjust the parameters within the plating chamber 120. The control panel 126 includes flow meters 128 and 130 which are connected to the plating chamber 120 via line 132. The flow meter 128 is connected to the carbon monoxide line 134 and the flow meter 130 is connected to the nitrogen line 136. Check valves 135 and 137 are provided in the lines 134 and 136, respectively.

In operation the carbon monoxide from the line 134 is used to saturate or fill the plating chamber area before plating for the purpose of removing any contaminants. The nitrogen from line 136, which flows through flow meter 130 to the plating chamber 120 through line 132, is used to purge the plating chamber 120 after the plating run is complete. There is a second parallel vaporizer stream which can be used sequentially or in parallel with the first vaporizer stream. The second vaporizer stream functions like the one previously described and includes the flow meters 110 and 111, which are connected via the line 113 to the vaporizer 114. Shut-off valves 106', 108', 110' and 111' are provided upstream of each of the flow meters 106, 108, 110, and 111, respectively.

A hydronic unit (hot water heater) 140 is provided to heat the fluid to vaporize the liquid carbonyl in the vaporizers 112 and 114. Basically, the hydronic unit 140 is in a closed loop with the vaporizers 112 and 114.

Figure 4:
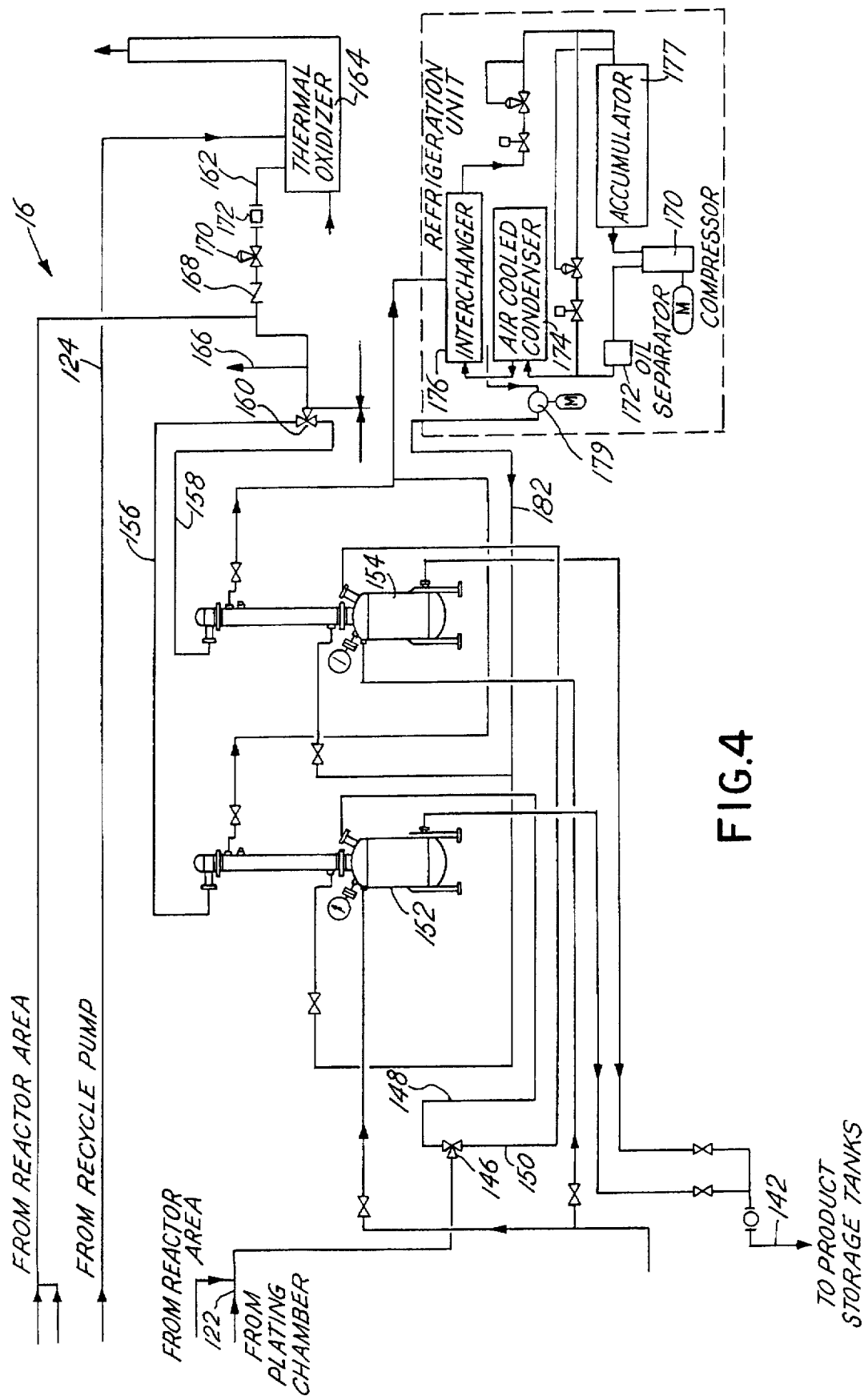
FIG. 4 is a schematic drawing of the reclaim and thermal oxidizer of the present invention.

With reference to FIG. 4, the vapors from the plating chamber 120 enter the reclaim and thermal oxidizer system 16 via the line 122. The vapors flow to the three way ball valve 146 and then through one or the other of lines 148, 150 to the reclaim condensers 152 and 154, respectively, where most of the liquid carbonyl is condensed. From the reclaim condensers 152 and 154 the liquid carbonyl flows via the lines 156 and 158 respectively, to the three way ball valve 160. The vapors may then pass to the recovery system 18 via the line 166. The treatment of the off gas from the reclaim condensers 152 and 154 is only a temperature and pressure control. At −20 degrees Fahrenheit and 6 inches water column pressure the percentage of nickel carbonyl in the gas stream is about 5.5 percent and the percent of carbon monoxide would be about 94.5 percent. The other possible gas in the stream would be gas liberated from the pattern material in the plating chamber, which may be a waste gas and possibly non-condensible. This gas will eventually be vented to the thermal oxidizer 164 for appropriate treatment as described. In the event of an over pressure situation in the reclaim system 16, the over pressure valve 170 opens and the vapors are discharged to the thermal oxidizer 164 via the line 162. In the thermal oxidizer 164 the vapors are decomposed and then exhausted to the atmosphere. A flame arrestor 172 is provided in the line 162 in order to prevent flash back from the burner in the thermal oxidizer 164. The main purpose of the thermal oxidizer 164 is to destroy any nickel carbonyl in the vented waste gas and to purge any remaining gas when the system is purged. The thermal oxidizer 164 will also function to destroy the nickel carbonyl in any gases released through the relief system. Thus the thermal oxidizer 164 is primarily for safety purposes to prevent the release of process gas to the atmosphere.

A refrigeration system 168 is provided to cool the ethylene glycol solution for use in the reclaim condensers 152 and 154. The refrigeration system includes a compressor 170, an oil separator 172, an air cooled condenser 174, an evaporator in the interchanger 176 and an accumulator 177 interconnected in a conventional fashion. The ethylene glycol is circulated through the lines 182 and 184 and the interchanger 176 by means of the circulating pump 179.

The temperature in the reclaim and thermal oxidizer system 16 must remain above freezing to prevent the reclaim condensers 152 and 154 from plugging with frozen nickel carbonyl. The purpose of lowering the temperature in the reclaim system is to condense as much nickel carbonyl as possible before compressing. This reduces the load on the recovery system 18 and will make some nickel carbonyl recovered in the reclaim system 16 available immediately. There is no change in the composition or state as a result of this process. The gas leaving the reclaim system is then sent to the first stage gas receiver 172 in the recovery system 18. On occasion the gas stream can be vented to the thermal oxidizer 164 to clear the system of contaminants.

The purpose of the back pressure regulator is to maintain the back pressure on the reclaim condensers 152 and 154 and a constant pressure in the plating system. A uniform pressure in the plating chamber is necessary for the process. Also the reclaim system can be better controlled with a stable pressure.

Turning now to FIG. 5, there is shown in more detail the vapor recovery system 18 of the present invention. The line 166 connects the reclaim and thermal oxidizer system 16 to the vapor recovery system 18. The vapors pass through the line 170 to the first stage vapor receiver 172. From the first stage vapor receiver 170, the vapors pass through the line 174 to the first stage compressor 178, which may be a Haskel air driven gas booster compressor AG Series, and through the line 176 to the first stage compressor 180, which may be likewise a Haskel air driven gas booster compressor. The gas is compressed by the compressors 178 and 180 to about 25 PSIG. Plant air passes from the plant supply line 182 to the air cylinders on each of the compressors 178 and 180 to operate the compressors. Disposed in the lines from the plant air supply 182 to each of the compressors 178 and 180 is a manual shut off valve 178' and 180', respectively. In the compressors 178 and 180, the process gas is heated due to compression to about 160 degrees Fahrenheit. The gases are compressed to about 25 PSIG.

The compressed vapors (mostly carbon monoxide) pass from the compressors 178 and 180 via the lines 186 and 188 respectively, to the first stage condensers 190 and 192, where the vapors are cooled. The vapors are cooled to minimize the possible nickel carbonyl in the reactor system (which may be condensed) from being vaporized by the hot gases. The condensers 190 and 192 may be conventional dual pipe condensers. Spent air passes from compressors 178 and 180 pass through lines connected to the plant air vent 184 and go directly to the thermal oxidizer 164 (FIG. 4).

In the condensers 190 and 192 the compressed gas is cooled and mixed with the vapors in the existing reactor system 12. Both the recovered and the reactor gas streams are recycled to the recycle pump receiver 52 in the reactor system 12 through the line 194 for reprocessing. Within the recycle pump suction receiver 52 the gas streams from the reactor system and the recovery system are mixed. The gas from the reactor system has been cooled and most of the condensed nickel carbonyl has been removed in the separator 48, however some of the nickel carbonyl may pass to the receiver 52 as droplets. These droplets when heated convert to nickel carbonyl gas. This conversion will happen even at lower temperature, but at a slower rate and with less increase in volume. The carbon monoxide in this gas stream is a gas and remains as a gas and does not condense. This recycling of the gas stream significantly reduces the waste products and the requirement for additional carbon monoxide.

It will be noted that after the gases are mixed in the recycle pump suction receiver 52, they are compressed a second time by the recycle compressor 70 to about 65 PSIG and then recycled through the reactor system 12 to produce nickel carbonyl, which is utilized in the plating system 14.

Each condenser 190 and 192 is connected to the plant cooling water supply 196 and the plant cooling water return 198. The discharge from each of the condensers 190 192 and passes to a line 194 which connects to the recycle pump receiver 52 (FIG. 2).

In operation of the nickel recovery system it is important that the temperature downstream of the compressors 178 and 180 be less than 180 degrees Fahrenheit in order to prevent plating within the closed system. The plating may result from the decomposition of the nickel carbonyl within the closed system.

The nickel deposition system includes a built-in safety system. If the recovery system were to stop, the gas pressure would rise to about 8–10 inch water column. The gas would be vented to the thermal oxidizer 164 through a pressure regulating valve 170 located near the thermal oxidizer 164. The vented gases would then be sent to the thermal oxidizer 164 where the gases would be decomposed and discharged to the atmosphere.

While there has been disclosed a presently preferred embodiment of the present invention, it will be apparent to persons skilled in the art that the invention may be otherwise embodied within the scope to the following claims.

I claim:

1. A nickel deposition system includes a reactor system, a plating system, and a reclaim system, and a vapor recovery system, said reclaim system including a receiver, said vapor recovery system including a first stage receiver for receiving vapors from the reclaim system, a first stage compressor operatively connected to the first stage receiver for pressurizing the vapor to about 25 PSIG, and a first stage condenser operatively connected to the first stage compressor for cooling the vapors, and means for forwarding the cooled vapors to a recycle pump receiver in the reactor system.

2. A nickel deposition system as in claim 1 including a second compressor and second condenser operatively connected to the first compressor and operating in parallel relationship to the first condenser.

3. A nickel deposition system which includes a reactor system for producing nickel carbonyl and storing same as a liquid, a plating system where the liquid carbonyl is vaporized and applied to product and deposited thereon, with carbon monoxide being released in the process, a reclaim system for cooling the gases received from the plating system and cooling them to a temperature just above its freezing point to condense out and recover the liquid carbonyl, said reclaim system including a reclaim condenser, and a vapor recovery system including a gas receiver for receiving vapors from the reclaim system, a first stage compressor operatively connected to the first stage receiver for pressurizing the vapor to about 25 PSIG, and a first stage condenser operatively connected to the first stage compressor for cooling the vapors, means for forwarding the cooled vapors to a recycle pump receiver in the reactor system, and means for compressing the gases from the recycle pump receiver to about 65 PSIG.

4. A nickel deposition system as in claim 3 including a second compressor and second condenser operatively connected to the first compressor and operating in parallel relationship to the first condenser.

5. A nickel deposition system as in claim 3 including a vaporizer in the plating system for vaporizing liquid nickel carbonyl, and a hot water heater operatively connected to the vaporizer for providing a source of heat to the vaporizer in heat transfer relationship with the liquid nickel carbonyl in the vaporizer to vaporize same.

6. A nickel deposition system as in claim 5 wherein the reclaim system includes a refrigeration unit for cooling water recirculated through the reclaim condenser to cool the nickel carbonyl vapors in the reclaim condenser.

7. A nickel deposition system as in claim 4 wherein the reclaim system includes a thermal oxidizer to destroy any nickel carbonyl in any gases that might be released to the atmosphere.

8. A nickel deposition system as in claim 4 wherein the first stage compressor is an air driven gas booster compressor.

9. A method of recovering nickel carbonyl in a nickel deposition system which includes a reactor system, a plating system, a reclaim system and a vapor recovery system comprising the steps of producing nickel carbonyl and storing same as a liquid, vaporizing the liquid nickel carbonyl, and applying the vaporized nickel carbonyl to a product to deposit nickel thereon and to release carbon monoxide, cooling the gases after the deposition of nickel on the product to a temperature just above its freezing point to condense out and recover the liquid nickel carbonyl, compressing vapors after the deposition of nickel on the product to about 25 PSIG, and recycling the compressed vapors, and compressing the vapors to about 65 PSIG to recover nickel carbonyl.

10. The method of claim 9 including the step of vaporizing the liquid nickel carbonyL by passing hot water in heat transfer relationship with the liquid nickel carbonyl.

11. The method of claim 9 including the step of passing all gases from the nickel deposition system through a thermal oxidizer prior to venting to the atmosphere to remove substantially all of the nickel carbonyl therefrom.

\* \* \* \* \*